(12) United States Patent
Mikata

(10) Patent No.: US 6,867,054 B2
(45) Date of Patent: Mar. 15, 2005

(54) METHOD OF MANUFACTURING A SEMICONDUCTOR DEVICE

(75) Inventor: Yuuichi Mikata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 10/107,299

(22) Filed: Mar. 28, 2002

(65) Prior Publication Data

US 2002/0142497 A1 Oct. 3, 2002

(30) Foreign Application Priority Data

Mar. 28, 2001 (JP) ........................................ 2001-093787

(51) Int. Cl.[7] .............................................. G01R 31/26
(52) U.S. Cl. ............................. 438/14; 438/16; 438/17; 438/18
(58) Field of Search ................................. 118/715, 725, 118/728; 239/1; 438/479, 488

(56) References Cited

U.S. PATENT DOCUMENTS

| | | |
|---|---|---|
| 5,166,080 A | 11/1992 | Schietinger et al. |
| 5,294,262 A | 3/1994 | Nishimura |
| 6,328,221 B1 * | 1/2001 | Moore et al. ................ 239/1 |

FOREIGN PATENT DOCUMENTS

| | | |
|---|---|---|
| JP | 4-239742 | 8/1992 |
| JP | 2001-7097 | 12/2001 |

OTHER PUBLICATIONS

Theodropuolou et al., "Model Reduction for Optimization of RTCVD Systems," IEEE Transactions on Semiconductor Manufacturing, vol. 11, No. 1, Feb. 1998, pp. 91–98.

* cited by examiner

Primary Examiner—David Nelms
Assistant Examiner—Renee R. Berry
(74) Attorney, Agent, or Firm—Finnegan, Henderson, Farabow, Garrett & Dunner, L.L.P.

(57) ABSTRACT

A method of manufacturing a semiconductor device is disclosed. The manufacturing method comprises heating a reactor, setting a semiconductor wafer in the reactor, supplying a reactive gas into the reactor to form a film on the semiconductor wafer or on an inner surface of the reactor, and measuring a temperature change outside the reactor and a temperature change inside the reactor to determine a thickness of the film on the semiconductor wafer or on the inner surface of the reactor on the basis of a relationship between a ratio of the temperature changes and a thickness of the film.

26 Claims, 4 Drawing Sheets

METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2001-093787, filed Mar. 28, 2001, the entire contents of which are incorporated herein by reference.

BACKGROUND OF THE INVENTION

1. Field of the Invention

The present invention relates to a method of manufacturing a semiconductor device in which a reactive gas is thermally decomposed to form a film on a semiconductor substrate, in particular, a method of forming a film by using a CVD (chemical vapor deposition) apparatus.

2. Description of the Related Art

In the manufacture of semiconductor devices including ICs and LSIs, a conductive film such as a PolySi (poly silicon) film and a W (tungsten) film is formed by using LPCVD (low pressure chemical vapor deposition) method.

FIG. 1 shows a schematic view of a LPCVD apparatus for forming a PolySi film.

Fifty to a hundred and fifty semiconductor wafers 11 are set on a boat 12, and introduced into a quartz tube 13. The quartz tube 13 includes therein an inner quartz tube 113. A heater 14 for heating the semiconductor wafers 11 is provided outside the quartz tube 13 and generates a radiant heat. The radiant heat of the heater 14 passes the wall of the outer quartz tube 13, the wall of the inner quartz tube 113, and then reaches and heats semiconductor wafers 11, so that the semiconductor wafers 11 are heated to a temperature of 600° C. A temperature near the heater 14 is measured by the outside thermocouple 111 provided outside the quartz tube 13, that is, between the heater 14 and the quartz tube 13 in detail, whereas a temperature near the semiconductor wafers 11 is measured by the inside thermocouple 112 provided inside the quartz tube 13.

The inside of the quartz tube 13 is evacuated by a pump 15 to reduce the pressure in the inside of the quartz tube 13, and an $SiH_4$ gas as a film forming gas is introduced into the quartz tube 13 via a nozzle 16, a mass flow controller 17 and a valve 18. The gas, after having been introduced into the quartz tube 13, passes through the inside of the inner quartz tube 113, and then is discharged through a gap between the inner quartz tube 113 and the quartz tube 13. The pressure inside the quartz tube 13 is maintained at 0.5 Torr by the conductance control of a main valve 110, based on an indication value of a pressure gage 19. The temperature of the semiconductor wafers 11 is controlled on the basis of a temperature measured by outer thermocouples 111 provided outside the quartz tube 13, i.e., between the heater 14 and the quartz tube 13 and inner thermocouples 112 provided inside the quartz tube 13. With the above arrangement, the $SiH_4$ introduced in the quartz tube 13 thermally is decomposed in the quartz tube 13, thus depositing PolySi on the semiconductor wafers 11. In this example, the outer thermocouples 111 are provided at three measuring points and similarly the inner thermocouples 112 are provided at three measuring points.

In this time, not only the temperature of the semiconductor wafers 11 but also the temperature of the wall of the quartz tube 13 are increased, thus depositing PolySi on the inner surface of the wall of the quartz tube 13. However, the temperature of the wall of the quartz tube 13 cannot be accurately measured: because quartz is semi-transparent with respect to radiant heat of the heater 14. For this reason, it is impossible to precisely determine how thick PolySi has been deposited on the inner surface of the wall of the quartz tube 13. Further, PolySi film having a thickness less than 1 μm is semi-transparent and allows infrared rays to pass therethrough. Therefore, as the thickness of the PolySi film on the inner surface of the wall of the quartz tube 13 is increased, then an amount of radiant heat that is received by the semiconductor wafers 11 changes, and thus the temperature of the semiconductor wafers 11 changes accordingly. Hence, in this state, it is impossible to manufacture PolySi films of a uniform thickness.

Conventionally, in order to avoid this problem, the PolySi deposited on the inner surface of the wall of the quartz tube 13 is removed by etching with gas or liquid of acid. Then, a PolySi film is deposited on the inner surface of the wall of the quartz tube 13 to a thickness of 0.3 μm or more, and typically to about 0.5 μm. Thereafter, a test film-formation is performed in order to confirm that the film forming conditions are proper. After that, the manufacturing process is performed. Since the conventional method needs the additional step of the PolySi film deposition, the operation rate of the manufacturing facility is low.

As described above, in the conventional method of manufacturing a semiconductor device, in order to assure the stability of the film formation, there must be added a step of depositing a PolySi film having a predetermined thickness in advance in the inner surface of the wall of the quartz tube 13 so that the thickness of the PolySi film deposited in the inner surface of the wall of the quartz tube 13 will increase to 1 μm or more during the manufacture process. This additional step decreases the operation rate of the apparatus.

BRIEF SUMMARY OF THE INVENTION

According to a first aspect of the present invention, there is provided a method of manufacturing a semiconductor device, comprising heating a reactor; setting a semiconductor wafer in the reactor; supplying a reactive gas into the reactor to form a film on the semiconductor wafer or on an inner surface of the reactor; and measuring a temperature change outside the reactor and a temperature change inside the reactor to determine a thickness of the film on the semiconductor wafer or on the inner surface of the reactor on the basis of a relationship between a ratio of the temperature changes and a thickness of the film.

According to a second aspect of the present invention, there is provided a method of manufacturing a semiconductor device, comprising comparing a temperature change outside of a reactor in which a semiconductor wafer is placed, with a temperature change inside the reactor, and determining a thickness of a film on the semiconductor wafer or on an inner surface of the reactor.

DETAILED DESCRIPTION OF THE INVENTION

Hereinafter, embodiments of the present invention will be described with reference to the drawings. The description will be based on the use of the low pressure CVD apparatus shown in FIG. 1, and therefore, will partly repeat the description already made by reference of the low pressure CVD apparatus shown in FIG. 1.

First, a first embodiment will be described with reference to FIG. 1 through FIG. 7.

Figure 1:
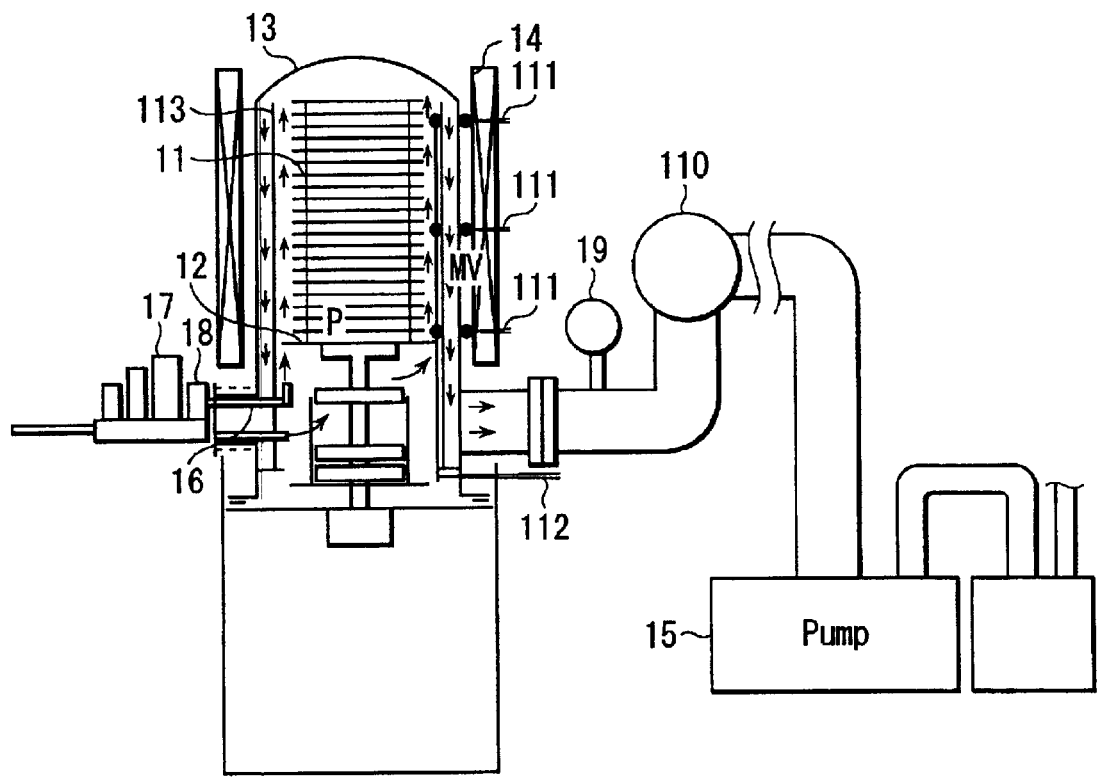
FIG. 1 is a sectional view of a low pressure CVD apparatus used in a conventional method as well as in a method according to an embodiment of the present invention.

As shown in FIG. 1, fifty to a hundred and fifty semiconductor wafers 11 are set on a boat 12, and introduced into a quartz tube i.e. a reactor 13. The quartz tube 13 includes therein an inner quartz tube 113. A heater 14 for heating the semiconductor wafers 11 is provided outside the quartz tube 13 and generates a radiant heat. The radiant heat of the heater 14 passes the wall of the outer quartz tube 13, the wall of the inner quartz tube 113, and then reaches and heats semiconductor wafers 11, so that the semiconductor wafers 11 are heated to a temperature of 600° C. A temperature near the heater 14 is measured by the outside thermocouple 111 provided outside the quartz tube or reactor 13, that is, between the heater 14 and the quartz tube 13 in detail, whereas a temperature near the semiconductor wafers 11 is measured by the inside thermocouple 112 provided inside the quartz tube or reactor 13.

The inside of the quartz tube 13 is evacuated by a pump 15 to reduce the pressure in the inside of the quartz tube 13, and an $SiH_4$ gas as a film forming gas is introduced into the quartz tube 13 via a nozzle 16, a mass flow controller 17 and a valve 18. The gas, after having been introduced into the quartz tube 13, passes through the inside of the inner quartz tube 113, and then is discharged through a gap between the inner quartz tube 113 and the quartz tube 13. The pressure inside the quartz tube 13 is maintained at 0.5 Torr by the conductance control of a main valve 110, based on an indication value of a pressure gage 19. The temperature of the semiconductor wafers 11 is controlled on the basis of a temperature measured by outer thermocouples 111 provided outside the quartz tube 13, i.e., between the heater 14 and the quartz tube 13 and inner thermocouples 112 provided inside the quartz tube 13. In this embodiment, the outer thermocouples 111 are provided at three measuring points and similarly the inner thermocouples 112 are provided at three measuring points. With the above arrangement, the $SiH_4$ introduced in the quartz tube 13 thermally is decomposed in the quartz tube 13, thus depositing PolySi on the semiconductor wafers 11.

Figure 2:
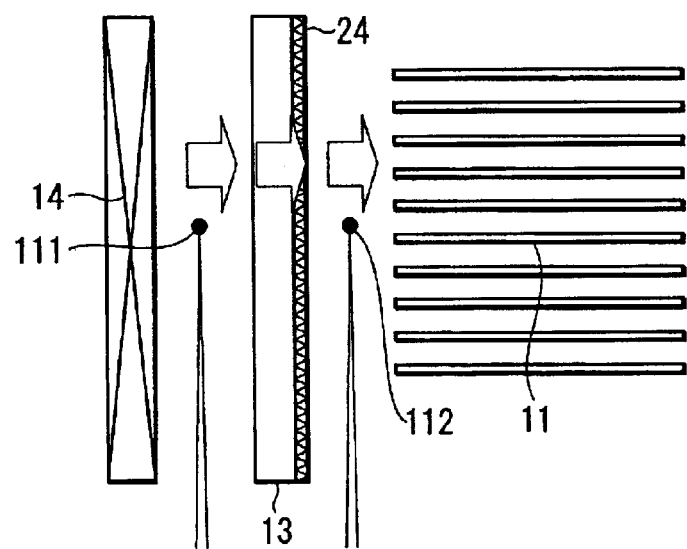
FIG. 2 is an enlarged view of a portion of the low pressure CVD apparatus.

FIG. 2 is an enlarged view of a portion of the low pressure CVD apparatus shown in FIG. 1 and is used for discussing the temperatures outside and inside of the quartz tube or reactor 13. For the sake of describing how the present embodiment can be applied in the low pressure CVD apparatus shown in FIG. 1, on a simple model, the arrangement from the heater 14 to the semiconductor wafers 11 is taken out and shown in FIG. 2, as the portion of the low pressure CVD apparatus. Also for simplifying the description with reference to FIG. 2, the inner quartz tube 113 is omitted in FIG. 2.

In the structure shown in FIG. 2, radiant heat of the heater 14 passes the wall of the quartz tube 13 and a PolySi film 24 deposited on the inner surface of the wall of the quartz tube 13, and then reaches and heats semiconductor wafers 11.

A temperature near the heater 14 is measured by the outside thermocouple 111 provided outside the quartz tube or reactor 13, whereas a temperature near the semiconductor wafers 11 is measured by the inside thermocouple 112 provided inside the quartz tube or reactor 13.

The radiant heat of the heater 14 is partially reflected on the outer surface of the wall of the quartz tube 13, and partially absorbed by the PolySi film 24 deposited on the inner surface of the wall of the quartz tube 13. Thus, an amount of the heat reaching the semiconductor wafers 11 is decreased.

Figure 3:
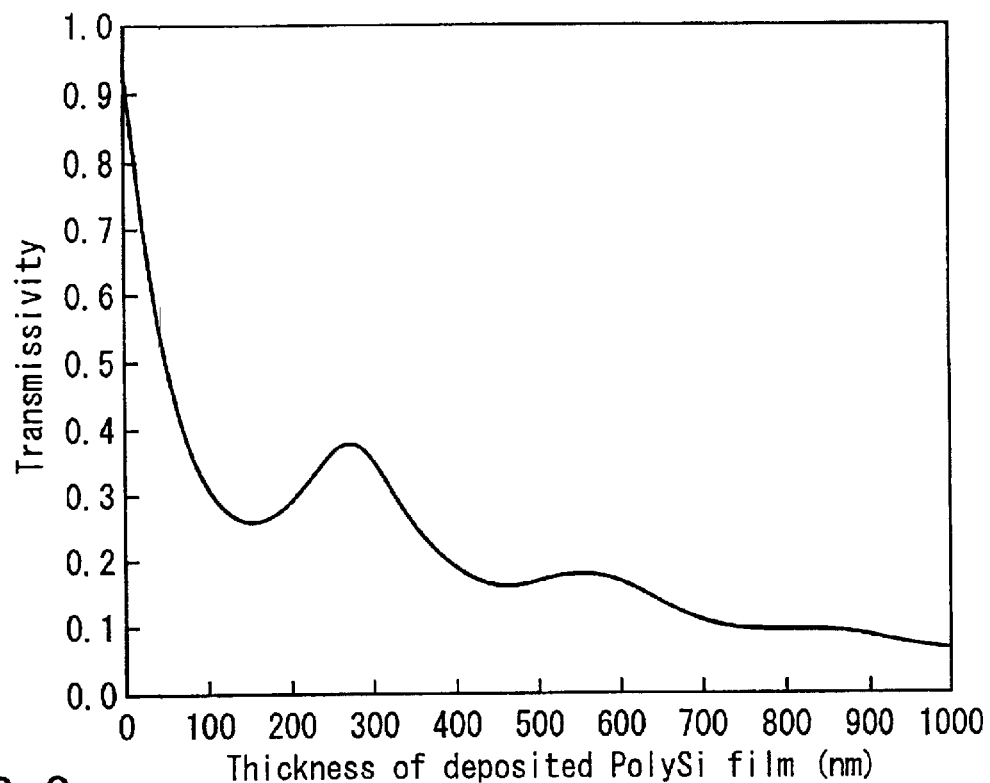
FIG. 3 is an infrared ray transmissivity characteristic curve when a PolySi film is deposited on a quartz tube.

FIG. 3 shows a calculation result indicating how the transmissivity of infrared ray changes in accordance with the thickness of the PolySi film 24, when the quartz tube 13 has a thickness of 1 cm.

The transmissivity of infrared ray decreases abruptly until the thickness of the PolySi film 24 increases to 100 nm. As the thickness of the PolySi film 24 further increases, the transmissivity of infrared ray continues decreasing in a vibratory pattern due to interference. When the film thickness is 1000 nm or more, the transmissivity of infrared ray is 0.1 or less, with a greater amount of the heat being reflected or absorbed by the PolySi film 24.

Actually, since the temperature of the PolySi film 24 gradually increases, the semiconductor wafers 11 are heated by the secondary radiant heat from the PolySi film 24. However, there is a time lag between the temperature increase of the PolySi film 24 and the temperature increase of the semiconductor wafers 11 due to the secondary radiated heat from the PolySi film 24. Thus, when the temperature of the heater 14 is increased abruptly, the temperature of the semiconductor wafers 11 does not follow the abrupt increase of the temperature of the heater 14. Accordingly, the temperature change rate (temperature rising rate or temperature falling rate) near the semiconductor wafers 11 is small, as compared to the temperature change rate near the heater 14. In particular, the larger the temperature change rate near the heater 14 is, the larger the difference between these two temperature change rates is.

Figure 4A:
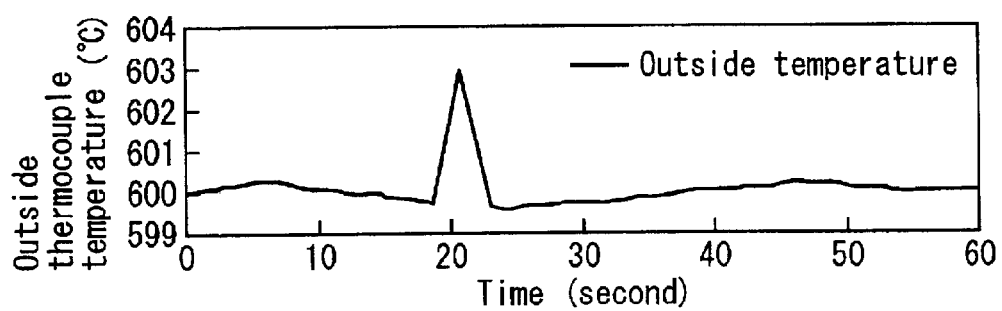
FIG. 4A is a characteristic curve showing an outside temperature change of the quartz tube without the PolySi film.
Figure 4B:
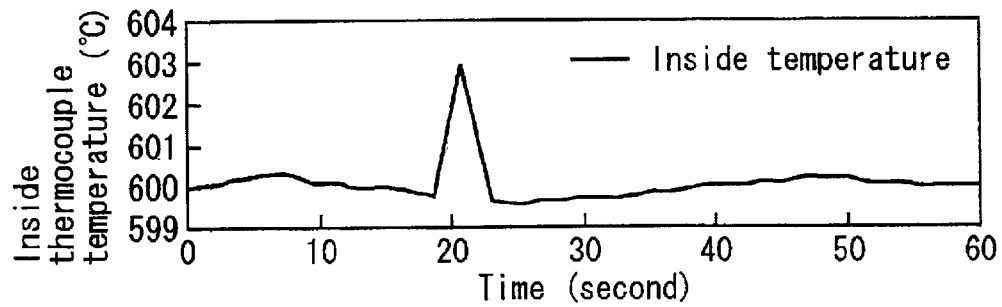
FIG. 4B is a characteristic curve showing an inside temperature change of the quartz tube without the PolySi film.

FIGS. 4A and 4B show experimental results obtained by using the low pressure CVD apparatus, for a case where there was formed no PolySi film on the inner surface of the wall of the quartz tube 13, and electric power input to the heater 14 was increased at a time point of 20 seconds for two seconds and then decreased to a normal level. FIG. 4A shows a temperature (° C.) indicated by the outer thermocouple 111 provided outside the quartz tube 13 with time (second), i.e., an outer temperature with time, and FIG. 4B shows a temperature (° C.) indicated by the inner thermocouple 112 provided inside the quartz tube 13 with time (second), i.e., an inner temperature with time. It was determined from the experimentation that the temperature change measured by the inside thermocouple 112 was almost the same as the temperature change measured by the outside thermocouple 111.

Figure 5A:
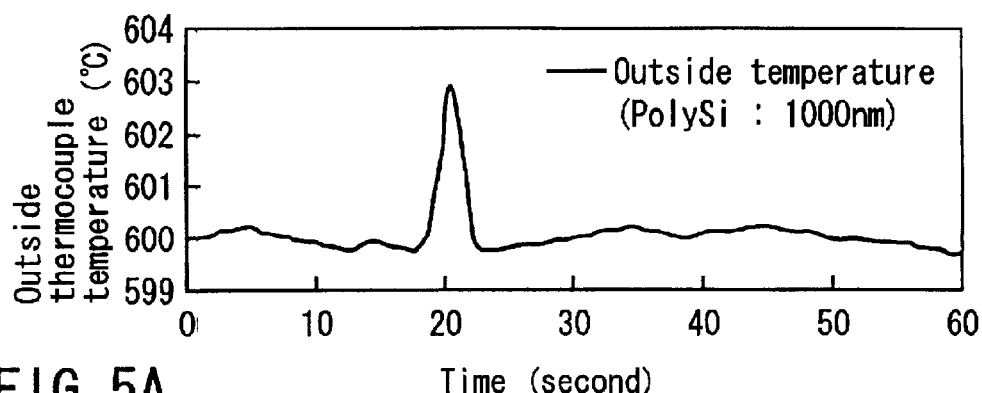
FIG. 5A is a characteristic curve showing an outside temperature change of the quartz tube, when a deposition of the PolySi film has a thickness of 1000 nm.
Figure 5B:
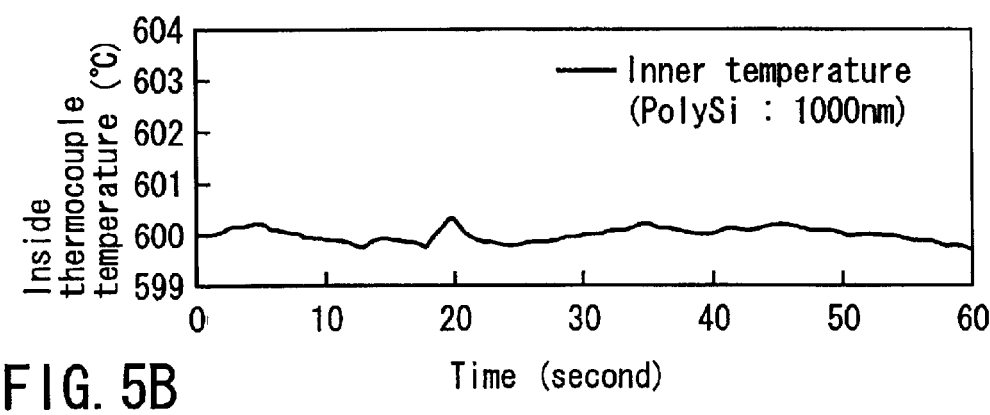
FIG. 5B is a characteristic curve showing an inside temperature change of the quartz tube, when a deposit of the PolySi film has a thickness of 1000 nm.
Figure 6:
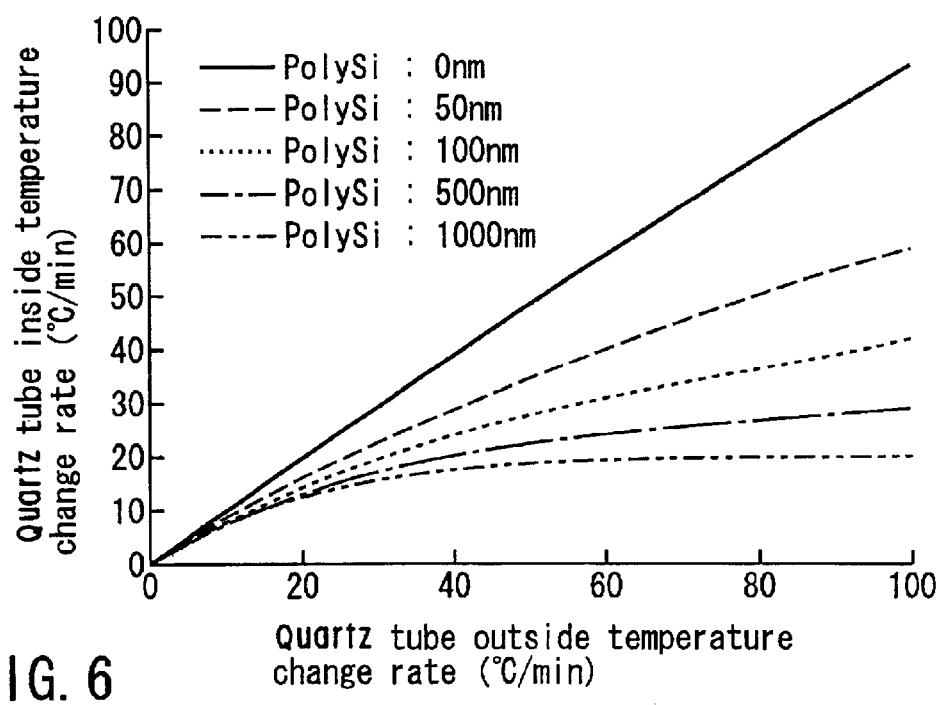
FIG. 6 is a characteristic curve showing dependency on the PolySi film, of the quartz tube inside temperature change with respect to the outside temperature change.
Figure 7:
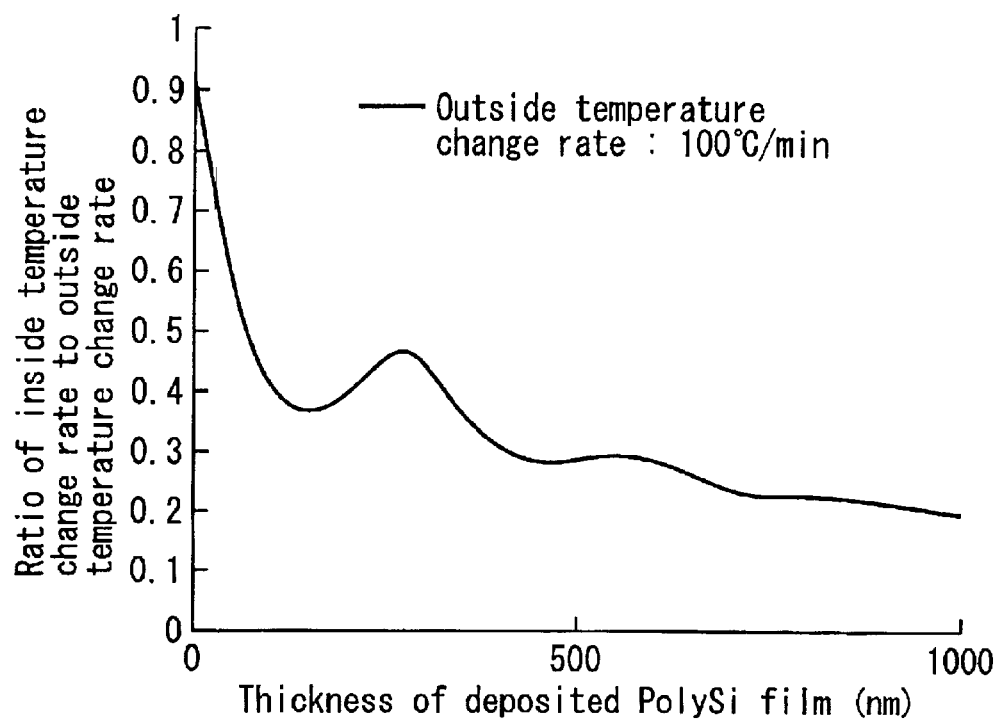
FIG. 7 is a characteristic curve showing dependency on the PolySi film, of the ratio of the quartz tube inside temperature change rate to the outside temperature change rate.

FIGS. 5A and 5B show experimental results obtained by using, the low pressure CVD apparatus, for a case where there was a PolySi film 24 of a thickness of 1000 nm on the inner surface of the wall of the quartz tube 13, and electric power input to the heater 14 was increased at a time point of 20 seconds for two seconds and then decreased to a normal level. The temperature change rate at this time was made about 100° C./min, which caused a large change of temperature measured by the outside thermocouple 111, on the other hand, a small change of temperature measured by the inside thermocouple 112. This phenomenon is because the radiant heat of the heater 14 was shielded by the PolySi film 24. Results of such experiments were summarized as shown in FIG. 6. It is understood that greater the temperature change rate on the outside of the quartz tube 13, the greater the dependency of the inside temperature change rate, on the thickness of the PolySi film 24. FIG. 7 shows a relationship between the ratio of the inside temperature change rate to the outside temperature change rate and the thickness of the PolySi film 24, when the outside temperature change rate is 100° C./min. It is understood that the result was similar to the result shown in FIG. 3. This relationship can be obtained in advance, and by using this relationship the thickness of the PolySi film 24 can be obtained if the thickness of the PolySi film 24 is 1000 nm or less, by measuring a response of the inside temperature, i.e., the inside temperature change rate in a case where the outside temperature is changed.

Furthermore, by obtaining in advance a relationship between the thickness of the PolySi film deposited on the inner surface of the wall of the quartz tube 13 and the thickness of the PolySi film deposited on the semiconductor wafers, it becomes possible to determine the thickness of the PolySi film deposited on the semiconductor wafers on the basis of the thickness relationship. Furthermore, when the thickness relationship is used for the semiconductor wafers in the manufacturing process, the film thickness deposited on the semiconductor wafers in the manufacturing process can also be determined, and thus the film thickness can be used as a monitor in the manufacturing process. Accordingly, it is possible to perform the manufacturing process without the beforehand formation of the additional Poly Si film which is required in the conventional manufacturing method. Hence, the operation rate of the low pressure CVD apparatus is improved.

In this embodiment, description has been made for the inside thermocouple 112 as being exposed within the quartz tube 13. In another case, the inside thermocouple 112 may be inserted into an elongated narrow quartz tube. In the case, the thermocouple 111 is essentially sandwiched between the two layers or walls of quartz tube 13. Thus, the transmissivity in this case can be obtained by multiplying the transmissivity values of the two layers of the quartz tube 13. For the arrangement as shown in FIG. 1, in which the quartz tube is a double-layer tube comprising the outer quartz tube 13 and the inner quartz tube 113, it may be interpreted that the thickness of the PolySi film is about three times the thickness of the PolySi film in a case where the arrangement is a single tube structure. In other words, in the double-layer tube arrangement, the PolySi film is deposited not only on the inner surface of the wall of the outer quartz tube 13 but also on the inner and outer surfaces of the wall of the inner quartz tube 113, and accordingly, the thickness of the PolySi film is about three times the thickness of the PolySi film of the single tube structure.

If the response of the inside thermocouple 112 is inadequately small in the arrangement shown in FIG. 1, then the inside thermocouple 112 may be moved to between the outer quartz tube 13 and the inner quartz tube 113. Furthermore, the above description was made for a specific temperature of 600° C. However, the description holds true for other temperatures. Thus, if there are obtained in advance the relationship between the temperature change rate inside the quartz tube 13 and the temperature change rate outside the quartz tube 13 and the relationship between the PolySi film deposited on the inner surface of the wall of the quartz tube 13 and the PolySi film deposited on the semiconductor wafers 11, it is possible to obtain the PolySi film thickness at a predetermined heat treatment temperature from the temperature change rate at the heat treatment. Further, in the present embodiment, the temperature change rate was measured during the film formation. However, the thickness of the deposited PolySi film can also be obtained by performing the same procedure after the film formation.

Next, reference will be made to FIG. 1, FIG. 2 and FIG. 7, to describe a second embodiment of the present invention.

With the first embodiment described above, a relationship between a ratio of the temperature change rate inside the quartz tube 13 to the temperature change rate inside the quartz tube 13 and the thickness of the PolySi film 24 deposited on the inner surface of the wall 23 of the quartz tube 13 is obtained in advance of the manufacturing process. Moreover, another relationship between the thickness of the PolySi film 24 deposited on the inner surface of the wall 23 of the quartz tube 13 and the thickness of the PolySi film deposited on the semiconductor wafers is obtained in advance. Using said another relationship, a thickness of a PolySi film formed on the semiconductor wafers in the device manufacturing process is obtained.

In the present embodiment, description will be made for a film formation started from a state in which no PolySi film 24 is formed on the inner surface of the wall of the quartz tube 13.

The ratio between the temperature change rate outside the quartz tube 13 and the temperature change rate inside the quartz tube 13 has a vibratory pattern as shown in FIG. 7, and thus, the PolySi film thickness at a given ratio cannot be absolutely determined. However, by starting the film formation from a state in which no PolySi film 24 is formed, and by periodically measuring the inside temperature change with respect to the outside temperature change, it becomes possible to determine how thick a PolySi film has been formed. Specifically, since the PolySi film 24 is deposited at a rate of 5 nm through 10 nm per minute, thus, by measuring the inside temperature change with respect to the outside temperature change every one minute, it becomes possible to determine the film thickness change at the step of about 10 nm, if there are obtained in advance the relationship of the temperature change rate inside the quartz tube 13 to the temperature change rate inside the quartz tube 13 and the relationship between the thickness of the PolySi film on the inner surface of the wall of the quartz tube 13 and the thickness of the PolySi film on the semiconductor wafers 11.

The above information is entered into a factory information system to determine the thickness of the PolySi film 24 by the system. Since by this system treatment the PolySi film thickness can be absolutely determined, then it is possible to judge whether a desired film thickness has been reached by the system. It is also possible to generate a stop signal at the system to stop the film formation at the film forming apparatus.

Steps for this procedure will be described with reference to FIG. 1. First, in order to initialize the low pressure CVD apparatus, semiconductor wafers which have undergone the preceding cycle of the film formation process are taken out, and then a boat 12 having no semiconductor wafers placed thereon is introduced into the quartz tube 13. $ClF_3$ gas is introduced at a rate of 2 SLM into the quartz tube 13 the inside of which is under the condition of 600° C. and 1 Torr to etch with the gas the PolySi film deposited on the inner surface of the wall 23 of the quartz tube 13 and the PolySi film deposited on the boat 12. After removing the PolySi films, the inside of the quartz tube 13 is purged out, then fed with $N_2$ gas to bring the inside back to the atmospheric pressure, and the boat 12 is taken out from the quartz tube 13. Thereafter, semiconductor wafers for products are set on the boat 12, and then introduced into the quartz tube 13. After that, the inside of the quartz tube 13 is low-pressurized to reduce the pressure therein and then the film formation is performed. The ratio of the inside temperature change rate with respect to the outside temperature change rate is measured every one minute from the start of the film formation, and the information is sent on line from the low pressure CVD apparatus to the factory computer system and stored therein.

In the system, the thickness of the film formed by deposition on the semiconductor wafers is calculated to determine the thickness of the film, on the basis of a pre-obtained database concerning the relationship between the inside temperature change rate with respect to the outside temperature change rate and the relationship between the thickness of the PolySi film on the inner surface of the wall of the quartz tube 13 and the thickness of the PolySi film on the semiconductor wafers. As the target film thickness is approached, the system calculates how many seconds are remaining till the target thickness is reached, and determines the timing to stop the film forming process. Upon the determined timing, the system sends a film formation stop signal to the manufacturing apparatus, so that the manufacturing apparatus stops the film formation operation. Then, a new cycle of the process begins with the etching of the deposited PolySi with $ClF_3$ gas; and then performs the film formation. By repeating this cycle of film formation and etching, the thickness of the PolySi film formed on the semiconductor wafers is controlled.

Next, a third embodiment of the present invention will be described with reference to FIG. 7.

In the above-described embodiments, description was made primarily for a formation of the PolySi film 24. With the present embodiment, description will be made for an application of the PolySi film 24 to the etching.

The PolySi film 24 is thinned by etching, and as understood from FIG. 7, when the thickness is 1000 nm or less, it is possible to determine the thickness of the PolySi film 24 (Horizontal Axis) on the quartz tube, from the ratio of the inner temperature change rate with respect to the outer temperature change rate (Vertical Axis). Therefore, during the process of etching the PolySi film 24 on the inner surface of the wall of the quartz tube 13 with the $ClF_3$ gas to thin the film thickness, it is possible to monitor the thickness of the PolySi film 24 on the inner surface of the wall of the quartz tube 13 and to judge whether or not the etching has ended. Furthermore, as described in the second embodiment, it is possible for the factory computer system to determine the thickness of the PolySi film 24 and thus determine the film thickness when the etching is started. Thus, it is also possible to define the film thickness to be etched. When the system determines that the etching has ended, the system issues an etching stop instruction after an over-etching time.

Figure 8:
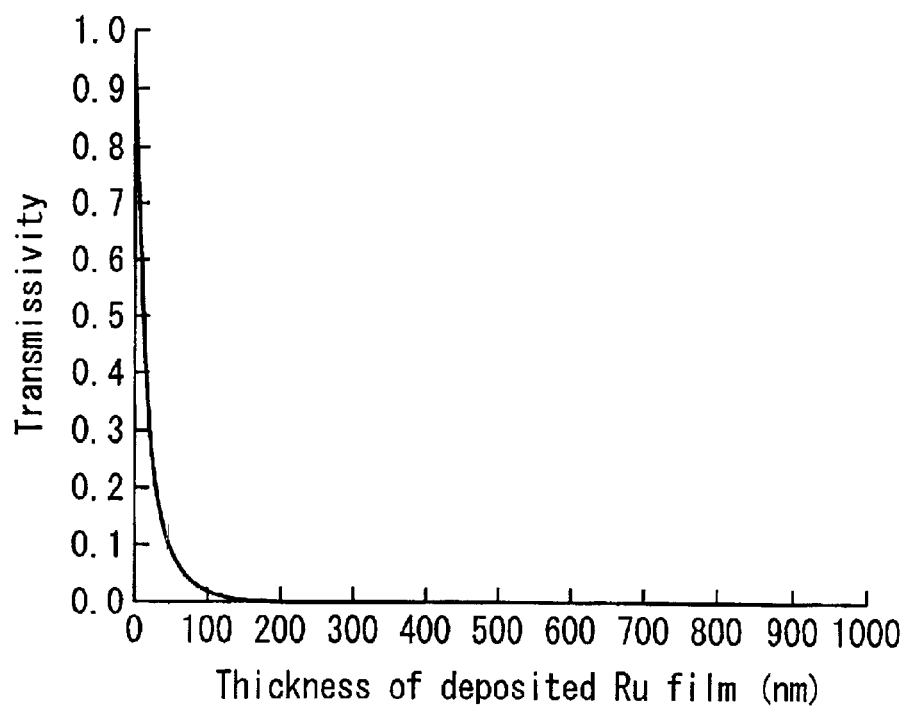
FIG. 8 is a characteristic curve showing an infrared ray transmissivity characteristic when Ru is deposited on a quartz tube.

Next, a fourth embodiment of the present invention will be described with reference to FIG. 8.

With the embodiments above described, the methods primarily work on the PolySi film. However, those methods described above can be applied not only to the PolySi film but also to any semi-transparent film. In the present embodiment, consideration will be made to LPCVD for Ru. Ru is a metal, which is given attention as a material of a capacitor electrode of DRAMs. FIG. 8 shows an infrared ray transmissivity characteristic of Ru deposited on an inner surface of a wall of a quartz tube. In FIG. 8, the vertical axis represents the transmissivity whereas the horizontal axis represents the thickness of the Ru film (nm) formed by deposition. Since Ru is a metal, infrared ray can no longer pass through the Ru film when the film thickness increases to 150 nm or more. It is possible to determine the thickness up to 150 nm of the Ru film deposited on the inner surface of the wall the quartz tube, based on the ratio of the inner temperature change rate with respect to the outer temperature change rate. Furthermore, when the Ru film is etched with a gas, it is possible to determine the timing when the etching has ended, as is the case for the PolySi film. Thus, the ratio of the inner temperature change rate with respect to the outer temperature change rate can be used as a monitor to determine the end point of the etching.

As has been described above, the manufacturing method of each of the embodiments includes measuring a abrupt change of temperature of the heater provided outside the quartz tube and a temperature inside the quartz tube to attain a relationship between the temperature changes, so that the thickness of the film deposited on the inner surface of the wall of the quartz tube is monitored in situ. Therefore, it has become possible to eliminate the additional step of depositing the PolySi film on the inner surface of the wall of the quartz tube in advance of the device manufacturing process, and to improve stability in the film formation.

What is claimed is:

1. A method of manufacturing a semiconductor device, comprising:
   heating a reactor;
   setting a semiconductor wafer in the reactor;
   supplying a reactive gas into the reactor to form a film on the semiconductor wafer or on an inner surface of the reactor; and
   measuring a temperature change outside the reactor and a temperature change inside the reactor to determine a thickness of the film on the semiconductor wafer or on the inner surface of the reactor on the basis of a relationship between a ratio of the temperature changes and a thickness of the film.

2. The method of manufacturing a semiconductor device according to claim 1, wherein the temperature change outside the reactor equal to 100° C./min or more.

3. The method of manufacturing a semiconductor device according to claim 1, wherein the setting of the semiconductor wafer in the reactor is introducing into the reactor a boat on which the semiconductor wafer is placed.

4. The method of manufacturing a semiconductor device according to claim 1, wherein the film is a semiconductor film.

5. The method of manufacturing a semiconductor device according to claim 1, wherein the film is formed by chemical vapor deposition.

6. The method of manufacturing a semiconductor device according to claim 1, wherein the reactive gas is $SiH_4$.

7. The method of manufacturing a semiconductor device according to claim 1, further comprising stopping the supplying of the reactive gas to the reactor in accordance with the thickness of the film.

8. The method of manufacturing a semiconductor device according to claim 7, wherein the setting of the semiconductor wafer in the reactor is introducing into the reactor a boat on which the semiconductor wafer is placed.

9. The method of manufacturing a semiconductor device according to claim 7, wherein the film is a semiconductor film.

10. The method of manufacturing a semiconductor device according to claim 7, wherein the film is formed by chemical vapor deposition.

11. The method of manufacturing a semiconductor device according to claim 7, wherein the reactive gas is $SiH_4$.

12. The method of manufacturing a semiconductor device according to claim 1, further comprising stopping the heating to the reactor in accordance with the thickness of the film.

13. The method of manufacturing a semiconductor device according to claim 12, wherein the setting of the semiconductor wafer in the reactor is introducing into the reactor a boat on which the semiconductor wafer is placed.

14. The method of manufacturing a semiconductor device according to claim 12, wherein the film is a semiconductor film.

15. The method of manufacturing a semiconductor device according to claim 12, wherein the film is formed by chemical vapor deposition.

16. The method of manufacturing a semiconductor device according to claim 12, wherein the reactive gas is $SiH_4$.

17. The method of manufacturing a semiconductor device according to claim 1, wherein the determining of the thickness of the film comprises sending the temperature change inside and outside the reactor on line to a system, and calculating the thickness of the film by the system on the basis of the relationship between the ratio of the temperature changes and the thickness of the film.

18. A method of manufacturing a semiconductor device, comprising comparing a temperature change outside of a reactor in which a semiconductor wafer is placed, with a temperature change inside the reactor, and determining a thickness of a film on the semiconductor wafer or on an inner surface of the reactor.

19. The method of manufacturing a semiconductor device according to claim 18, wherein the temperature change outside the reactor is not smaller than 100° C./min.

20. The method of manufacturing a semiconductor device according to claim 18, further comprising stopping the supplying of the reactive gas to the reactor in accordance with the thickness of the film.

21. The method of manufacturing a semiconductor device according to claim 18, further comprising stopping the heating to the reactor in accordance with the thickness of the film.

22. The method of manufacturing a semiconductor device according claim 18, further comprising removing the film deposited on the inner wall of the reactor in accordance with the thickness of the film.

23. The method of manufacturing a semiconductor device according to claim 18, wherein the determining of the thickness of the film comprising sending the temperature change online to a system, and calculating the thickness of the film by the system on the basis of the temperature changes.

24. The method of manufacturing a semiconductor device according to claim 18, wherein the film is a semiconductor film.

25. The method of manufacturing a semiconductor device according to claim 15, wherein the film is formed by chemical vapor deposition.

26. The method of manufacturing a semiconductor device according to claim 1, wherein the reactive gas is $SiH_4$.

* * * * *